(12) United States Patent
Tani

(10) Patent No.: US 7,241,550 B2
(45) Date of Patent: Jul. 10, 2007

(54) METHOD AND APPARATUS FOR MULTIPHOTON-ABSORPTION EXPOSURE WHEREIN EXPOSURE CONDITION IS CHANGED WITH DEPTH OF CONVERGENCE POSITION

(75) Inventor: Takeharu Tani, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 490 days.

(21) Appl. No.: 10/936,796

(22) Filed: Sep. 9, 2004

(65) Prior Publication Data
US 2005/0057736 A1    Mar. 17, 2005

(30) Foreign Application Priority Data
Sep. 11, 2003  (JP) .............................. 2003-319735

(51) Int. Cl.
*G03B 27/00*  (2006.01)
*G03F 7/00*  (2006.01)

(52) U.S. Cl. ........................................ 430/269; 355/55
(58) Field of Classification Search ..................... None
See application file for complete search history.

(56) References Cited

U.S. PATENT DOCUMENTS

| | | |
|---|---|---|
| 7,166,409 B2 * | 1/2007 | Fleming et al. .............. 430/269 |
| 2001/0001607 A1 | 5/2001 | Miyauchi et al. |
| 2003/0052311 A1 | 3/2003 | Inagaki et al. |

OTHER PUBLICATIONS

Shoji Maruo, et al., "Three-dimensional microfabrication with two-photon-absorbed photopolymerization", Optic Letters, vol. 22, No. 2, Jan. 15, 1997, pp. 132-134.
Yoshihiko Adachi, et al., "Two-Photon-absorption Optical-fabrication with a Micro-lens Array", Extended Abstracts (The 50th Spring Meeting, 2003); The Japan Society of Applied Physics and Related Societies 27p-YN-4, Mar. 2003.

* cited by examiner

*Primary Examiner*—Nikita Wells
(74) *Attorney, Agent, or Firm*—Sughrue Mion, PLLC

(57) ABSTRACT

A multiphoton-absorption exposure apparatus for exposing a multiphoton absorption material by applying light to the multiphoton absorption material so that the light converges at a predetermined convergence position, in which an exposure-condition control unit is provided for changing an exposure condition so that optical reactions are more likely to occur when the predetermined convergence position is located deeper in the multiphoton absorption material.

13 Claims, 1 Drawing Sheet

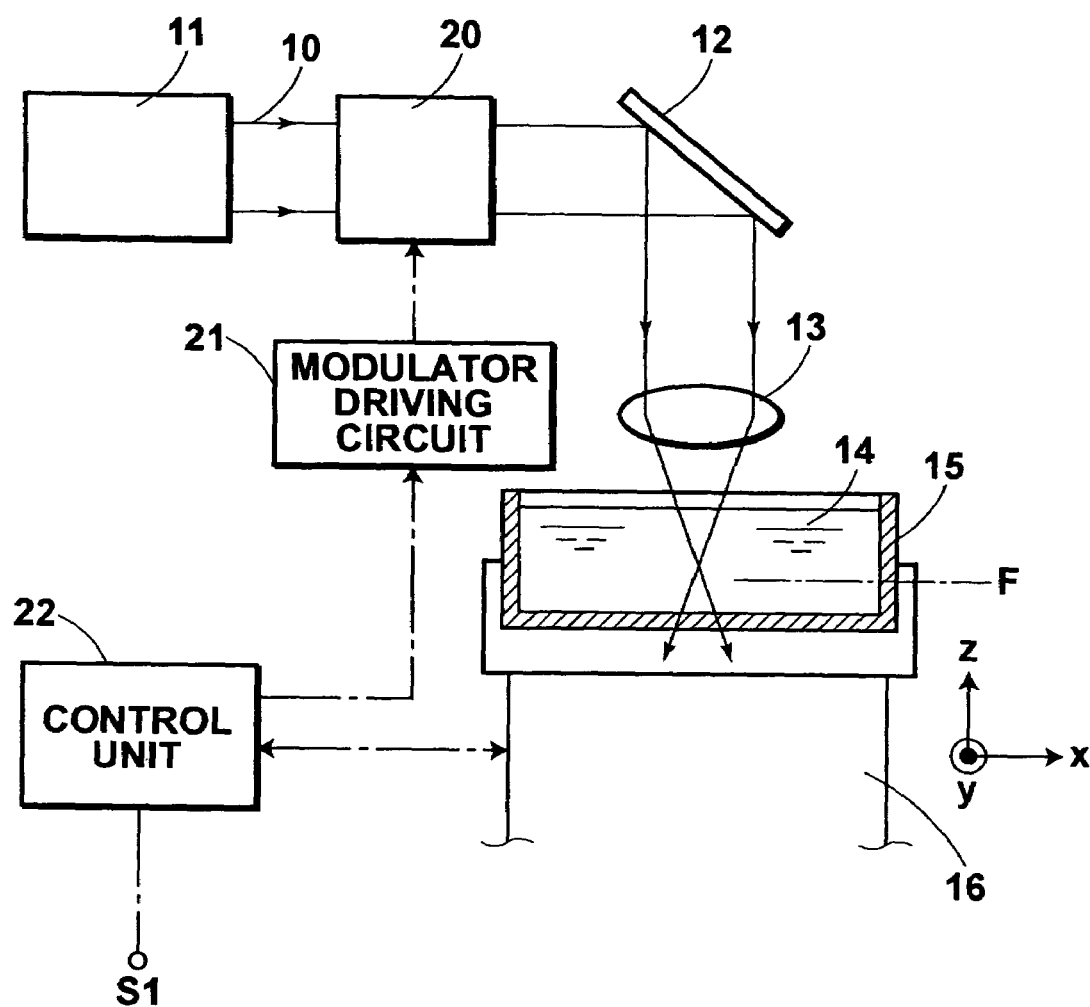

METHOD AND APPARATUS FOR MULTIPHOTON-ABSORPTION EXPOSURE WHEREIN EXPOSURE CONDITION IS CHANGED WITH DEPTH OF CONVERGENCE POSITION

BACKGROUND OF THE INVENTION

1. Field of the Invention

The present invention relates to a multiphoton-absorption exposure method and a multiphoton-absorption exposure apparatus for exposing a recording medium or the like by using multiphoton absorption (such as two-photon absorption), which is known as one of the nonlinear optical effects.

2. Description of the Related Art

The following documents (1) to (4) disclose information related to the present invention.
(1) U.S. Patent Laid-Open No. 20010001607
(2) U.S. Patent Laid-Open No. 20030052311
(3) "Three-dimensional Microfabrication with Two-photon-absorbed photopolymerization" by S. Maruo et al., (OPTICS LETTERS, Vol. 22, No. 2, pp.132–134, Jan. 15, 1997)
(4) "Two-photon-absorption Optical-fabrication with a Micro-lens Array" by Y. Adachi et al., (Extended Abstracts of the 50th Spring Meeting of the Japan Society of Applied Physics and Related Societies, 27p-YN-4, March 2003)

Although only one photon is absorbed in most light absorption processes occurring in materials, exposure to high-power light such as ultrashort pulse laser light can cause the so-called multiphoton absorption, in which two or more photons are simultaneously absorbed. For example, the amount of energy which a material receives in the two-photon absorption is twice the amount of energy which a material receives in the single-photon absorption, and reactions of two-photon absorption caused by exposure to high-power light having a wavelength 21 (in which the photon energy is half of that in the light having a wavelength 1) to a material which primarily absorbs the light having the wavelength 1 are equivalent to reactions caused by exposure to the light having the wavelength 1.

The probability of multiphoton absorption increases in proportion to the photon density. Therefore, when converging light is applied to a multiphoton absorption material, it is possible to selectively cause multiphoton absorption only in the vicinity of a convergence position of the converging light, where the photon density is maximized at the convergence position. Thus, when a recording material is realized by a material in which a change in the phase, the refractive index, the chemical state, or the like is caused by multiphoton absorption, it is possible to record information in a plurality of layers in the recording material by exposing the recording material to converging light, and specifically by scanning each layer with the converging light and shifting the depth of the convergence position to the next layer in order to scan the next layer. The aforementioned document (1) discloses an example of an apparatus which records information by scanning a multiphoton absorption material with converging light for exposure as mentioned above.

In other disclosed methods, three-dimensional optical molding of a multiphoton absorption material in which a photopolymerization reaction occurs is performed by three-dimensionally exposing the multiphoton absorption material to converging light, where the above-mentioned fact that multiphoton absorption is caused only in the vicinity of the convergence position of the converging light is utilized. The aforementioned documents (3) and (4) disclose examples of apparatuses for performing three-dimensional optical molding of a multiphoton absorption material as mentioned above. In addition, the document (4) also discloses a method for splitting a single laser beam into a plurality of laser beams by use of a microlens array, and concurrently molding a plurality of three-dimensional structures by use of the plurality of laser beams.

Further, the document (2) discloses examples of preferable multiphoton absorption materials which have great two-photon absorption cross sections. For example, when light-curing resin is mixed into the multiphoton absorption materials, such multiphoton absorption materials become applicable to optical molding.

However, conventionally, when three-dimensional, information recording, optical molding, and the like are performed by exposing multiphoton absorption materials as mentioned above, the probability of occurrence of optical reactions varies with the depth of the exposure in the multiphoton absorption materials. Therefore, the exposure becomes insufficient or excessive.

SUMMARY OF THE INVENTION

The present invention has been developed in view of the above circumstances.

The object of the present invention is to provide a multiphoton-absorption exposure method and a multiphoton-absorption exposure apparatus which realize satisfactory exposure regardless of the depth of the exposure in a multiphoton absorption material.

(I) In order to accomplish the above first object, the first aspect of the present invention is provided. According to the first aspect of the present invention, there is provided a multiphoton-absorption exposure method for exposing a multiphoton absorption material. The multiphoton-absorption exposure method comprises the steps of: (a) changing an exposure condition for exposing the multiphoton absorption material to light so that optical reactions are more likely to occur when the light converges at deeper positions in the multiphoton absorption material; and (b) applying the light to the multiphoton absorption material so that the light converges at a predetermined convergence position in the multiphoton absorption material under the exposure condition changed in the step (a).

Preferably, the multiphoton-absorption exposure method according to the first aspect of the present invention may also have one or any possible combination of the following additional features (i) to (iv).

(i) The exposure condition may include at least one of an exposure intensity, an exposure time, and a wavelength of the light.

(ii) In the multiphoton-absorption exposure apparatus having the feature (i), at least one of the exposure intensity and the exposure time may be controlled by modulating the light with a light modulator.

(iii) The light may be pulsed light emitted from a pulse laser.

(iv) The multiphoton absorption material may be an ultraviolet-curing resin.

(v) The multiphoton absorption material may be three-dimensionally exposed by controlling the convergence position in three directions including a depth direction and two directions which are different from the depth direction.

(II) In order to accomplish the above second object, the second aspect of the present invention is provided. According to the second aspect of the present invention, there is provided a multiphoton-absorption exposure apparatus for exposing a multiphoton absorption material. The multiphoton-absorption exposure apparatus comprises: an exposure-condition control unit which changes an exposure condition for exposing the multiphoton absorption material to light so that optical reactions are more likely to occur when the light converges at deeper positions in the multiphoton absorption material; and an exposure unit which applies the light to the multiphoton absorption material so that the light converges at a predetermined convergence position under the exposure condition changed by the exposure-condition control unit.

Preferably, the multiphoton-absorption exposure apparatus according to the second aspect of the present invention may also have one or any possible combination of the aforementioned additional feature (i) and the following additional features (vi) to (x).

(vi) The multiphoton-absorption exposure apparatus having the aforementioned feature (i) may further comprise a light modulator which modulates the light so as to control at least one of the exposure intensity and the exposure time.

(vii) The multiphoton-absorption exposure apparatus according to the second aspect of the present invention may further comprise a pulse laser which emits pulsed light as the light.

(viii) The multiphoton-absorption exposure apparatus according to the second aspect of the present invention may further comprise a three-dimensional-exposure control unit which controls the convergence position in three directions including a depth direction and two directions which are different from the depth direction, for realizing three-dimensional exposure of the multiphoton absorption material.

(ix) In the multiphoton-absorption exposure apparatus having the above feature (viii), the three-dimensional-exposure control unit may include a three-axis movement table for three-dimensionally moving the multiphoton absorption material with respect to the light.

(x) The multiphoton-absorption exposure apparatus according to the second aspect of the present invention may further comprise a storage unit which stores a table defining exposure conditions for possible values of the depth of the predetermined convergence position, and the exposure-condition control unit may determine the exposure condition for exposing the multiphoton absorption material, by referring to the table based on an actual value of the depth of the predetermined convergence position.

(III) The advantages of the present invention are explained below.

Through the present inventor's research, it is found that the probability of occurrence of optical reactions varies with the depth in the multiphoton absorption material since the exposure light is scattered or absorbed by the multiphoton absorption material before the exposure light reaches the convergence position, and the convergence spot spreads due to aberration. The degree of the above scattering or absorption and the spread of the convergence spot increase with the depth. However, conventionally the exposure condition is fixed regardless of the depth of the convergence position. Therefore, when the convergence position is located deeper, the optical reactions are less likely to occur.

In view of the above findings, in the multiphoton-absorption exposure method according to the first aspect of the present invention, the exposure condition is changed so that optical reactions are more likely to occur when the predetermined convergence position is located deeper in the multiphoton absorption material. Therefore, it is possible to compensate for the difference in the probability of occurrence of the above scattering, absorption, and the like, and substantially equalize the probability of occurrence of optical reactions at all depths.

In addition, the multiphoton-absorption exposure apparatus according to the second aspect of the present invention comprises an exposure-condition control unit which changes the exposure condition so that optical reactions are more likely to occur when the predetermined convergence position is located deeper in the multiphoton absorption material. Therefore, it is possible to automatically compensate for the difference in the probability of occurrence of the above scattering or absorption, and substantially equalize the probability of occurrence of optical reactions at all depths.

Further, when the multiphoton-absorption exposure apparatus according to the second aspect of the present invention comprises a storage unit which stores a table defining exposure conditions for possible values of the depth of the predetermined convergence position, and the exposure-condition control unit determines the exposure condition by referring to the table based on an actual value of the depth of the predetermined convergence position, it is possible to make the exposure condition appropriate at all times, and realize more stable exposure.

DESCRIPTION OF THE DRAWINGS

FIGURE is a schematic side view of a multiphoton-absorption exposure apparatus according to an embodiment of the present invention.

DESCRIPTION OF PREFERRED EMBODIMENTS

An embodiment of the present invention is explained in detail below with reference to the drawing.

First, an image exposure apparatus according to the embodiment of the present invention is explained below.

FIGURE is a schematic side view of a multiphoton-absorption exposure apparatus according to an embodiment of the present invention. In the example of FIGURE, the multiphoton-absorption exposure apparatus realizes a three-dimensional optical molding apparatus. As illustrated in FIGURE, the multiphoton-absorption exposure apparatus according to the present embodiment comprises a pulse laser 11, a mirror 12, a condensing lens 13, a resin vessel 15, and a three-axis movement table 16. The pulse laser 11 emits pulsed light 10 as exposure light as illustrated in FIGURE. The mirror 12 bends the optical path of the pulsed light 10 by 90 degrees. The condensing lens 13 converges the pulsed light 10 after the pulsed light 10 is reflected by the mirror 12. A liquid resin 14 for optical molding (hereinafter referred to as the optical-molding resin) is pooled in the resin vessel 15, which is fixed on the three-axis movement table 16. The three-axis movement table 16 can linearly move the resin vessel 15 in each of the x, y, and z directions in very small steps.

In addition, the multiphoton-absorption exposure apparatus of FIGURE further comprises a light modulator 20, a modulator driving circuit 21, and a control unit 22. The light modulator 20 is inserted in the optical path of the pulsed light 10 between the pulse laser 11 and the mirror 12, and is, for example, an acoustic-optical light modulator (AOM). The modulator driving circuit 21 drives the light modulator 20. The control unit 22 controls the operations of the modulator driving circuit 21 and the movement of the three-axis movement table 16, and is realized by, for example, a computer system.

The pulse laser 11 is, for example, a Ti:sapphire laser. In this embodiment, the pulse laser 11 has an average output power of 1 W, an oscillation wavelength of 780 nm, a pulse repetition frequency of 82 MHz, and a pulse width of 100 fs (femtoseconds). In addition, the condensing lens 13 has a numerical aperture (NA) of 0.7 and a magnification power of 100. Further, the optical-molding resin 14 is an ultraviolet-curing resin in which two-photon absorption occurs, e.g., an epoxy resin. A concrete example of such a resin is SCR-701 (available from D-MEC Ltd. in Japan), which is disclosed in the aforementioned document (2).

Hereinbelow, the operations of exposure performed by the above multiphoton-absorption exposure apparatus are explained. In order to perform exposure for three-dimensional optical molding, first, the position, in the z direction, of the resin vessel 15 containing the optical-molding resin 14 is maintained by controlling the movement of the three-axis movement table 16. In this situation, the pulse laser 11 is driven so that the pulsed light 10 is emitted. Then, the control unit 22 controls the operation of the modulator driving circuit 21 based on a signal Si which indicates a three-dimensional shape to be molded, so that, for example, on-off modulation of the pulsed light 10 is performed.

The modulated pulsed light 10 is reflected by the mirror 12, and then the condensing lens 13 makes the pulsed light 10 converge inside the optical-molding resin 14. The resin vessel 15 containing the optical-molding resin 14 is moved in the x and y directions in very small steps while maintaining the position of the resin vessel 15 in the z direction. Thus, the entire x-y plane at a position in the z direction is two-dimensionally scanned with and exposed to the modulated pulsed light 10. As mentioned before, the pulsed light 10 has the pulse width as short as 100 fs, and therefore the photon density becomes extremely high in the vicinity of and at the convergence position F of the pulsed light 10. Thus, only in the vicinity of and at the convergence position F of the pulsed light 10, two-photon absorption occurs as mentioned before, photopolymerization occurs as in the case of absorption of ultraviolet light having a wavelength of 390 nm (=780/2 nm) by the optical-molding resin, and the optical-molding resin 14 is cured.

When the above two-dimensional scanning with the pulsed light 10 is completed, the resin vessel 15 containing the optical-molding resin 14 is moved in the z direction by a very small amount which is predetermined, and two-dimensional scanning with and exposure to the modulated pulsed light 10 are performed at the position moved in the z direction as performed before the convergence position is moved in the z direction. Thereafter, movement of the resin vessel 15 in the z direction and two-dimensional scanning with the pulsed light 10 are repeated, and finally three-dimensional scanning and exposure of the optical-molding resin 14 is realized. Thus, the optical-molding resin 14 is cured so as to form the three-dimensional shape corresponding to the signal S1, i.e., a desired shape is molded from the optical-molding resin 14.

Instead of the on-off modulation of the pulsed light 10 based on the signal Si, the light modulator 20 can continuously change the transmittance through the light modulator 20, for example, within the range from 0 to 100%, and the control unit 22 controls the operation of the modulator driving circuit 21 according to the position of the three-axis movement table 16 in the z direction so that the transmittance through the light modulator 20 increases with the depth of the convergence position F in the optical-molding resin 14 (measured from the incident surface of the optical-molding resin 14, through which the pulsed light 10 enters the optical-molding resin 14).

As explained before, the pulsed light 10 as the exposure light can suffer from scattering and absorption by the multiphoton absorption material before the pulsed light 10 reaches the convergence position F, and the convergence spot spreads due to aberration. In addition, the probability of occurrence of such phenomenons increases with the depth of the convergence position F. Therefore, if the exposure condition is fixed regardless of the depth of the convergence position F, the desired optical reactions are less likely to occur when the depth of the convergence position F increases.

On the other hand, in the multiphoton-absorption exposure apparatus according to the present embodiment, the intensity of the light which passes through the light modulator 20, i.e., the exposure intensity, is increased with the depth of the convergence position F. Therefore, it is possible to compensate for the difference in the probability of occurrence of the scattering, absorption, and the like, and substantially equalize the probability of occurrence of optical reactions at all depths in the optical-molding resin 14. Thus, it is possible to realize satisfactory exposure without insufficiency or excess at all times. This advantage of the present invention is explained in further detail below, where the present invention is compared with comparison examples (1 and 2), to which the present invention is not applied.

First, in the comparison example 1, the optical-molding resin 14 is three-dimensionally exposed under a fixed exposure condition which optimizes the exposure, for example, in the vicinity of the incident surface of the optical-molding resin 14. For example, this exposure condition is that the average output power of the exposure light is 10 mW, and the illumination time for curing each point is 1 ms (millisecond). In this case, the present inventor has observed insufficient exposure when the depth of the convergence position F increases. For example, when the depth of the convergence position F exceeds 300 micrometers, the optical-molding resin 14 cannot be cured.

Next, in the comparison example 2, the optical-molding resin 14 is three-dimensionally exposed under a fixed exposure condition which optimizes the exposure, for example, at the depth of 300 micrometers in the optical-molding resin 14. For example, this exposure condition is that the average output power of the exposure light is 20 mW, and the illumination time for curing each point is 1 ms (millisecond). In this case, when the convergence position F is near to the incident surface of the optical-molding resin 14, the exposure becomes excessive, and the resolution deteriorates or the optical-molding resin 14 boils due to local heat absorption.

On the other hand, the present inventor has confirmed that satisfactory exposure is enabled regardless of the depth of the convergence position F in the embodiment of the present invention when the illumination time for curing each point (i.e., the exposure time) is maintained at 1 ms (millisecond), and the intensity of the light which passes through the light modulator 20 is changed, for example, for every 50 µm change in the depth of the convergence position F so that the output power of the exposure light is changed within the range of 10 to 50 mW. Specifically, the present inventor has confirmed that satisfactory exposure without insufficiency or excess is enabled in the region of the optical-molding resin 14 from the vicinity of the incident surface to the depth of 1 mm.

Alternatively, the present inventor has also confirmed that satisfactory exposure is enabled regardless of the depth of the convergence position F in the embodiment of the present invention when the intensity of the light which passes through the light modulator 20 is maintained at the average output power of 10 mW, and the illumination time for curing each point (i.e., the exposure time) is changed, for example, for every 50 μm change in the depth of the convergence position F within the range of 1 ms to 100 ms.

As understood from the above explanations, the aforementioned exposure-condition control unit in the second aspect of the present invention, which changes an exposure condition so that optical reactions are more likely to occur when the predetermined convergence position is located deeper in the multiphoton absorption material, is realized by the light modulator 20, the modulator driving circuit 21, and the control unit 22.

It is possible to obtain values of the exposure time or the output power of the exposure light (i.e., the exposure intensity) at respective convergence positions F which are appropriate for realizing the above change in the exposure condition, based on experiments or experiences. In addition, it is convenient that the appropriate values of the exposure time or the output power of the exposure light are stored in advance in a storage in correspondence with the respective convergence positions F in the form of a table so that the appropriate values can be read out from the table and set when exposure is actually performed. In this case, it is possible to make the exposure condition appropriate at all times, and realize more stable exposure. Further, after the appropriate values of the exposure time or the output power of the exposure light at the respective convergence positions F are obtained based on the experiments or experiences, additional values of the exposure time or the output power of the exposure light interpolating between the above appropriate values based on the experiments or experiences can be obtained by calculation, so that appropriate values of the exposure time or the output power of the exposure light can be obtained more finely.

Further, it is possible to change the wavelength of the exposure light, instead of the exposure time or the output power of the exposure light (the exposure intensity), according to the convergence position. The efficiency of the multiphoton absorption reactions varies with the wavelength of the exposure light. Therefore, when the wavelength of the exposure light is changed so that the efficiency of the multiphoton absorption reactions increases with the depth of the convergence position F in the multiphoton absorption material, it is possible to substantially equalize the probability of occurrence of optical reactions at all depths in the multiphoton absorption material. Since the oscillation wavelength of the aforementioned Ti:sapphire laser can be changed in the range about 700 to 1,000 nm, it is preferable to use the Ti:sapphire laser in the case where the wavelength of the exposure light is changed according to the present invention.

Although the multiphoton-absorption exposure apparatus realizes a three-dimensional optical molding apparatus in the above embodiment, the present invention can also be applied to multiphoton-absorption exposure apparatuses realizing information recording apparatuses which perform multilayer recording in optical disks or the like. In such cases, advantages similar to those of the above embodiment are obtained.

In addition, all of the contents of the Japanese patent application No. 2003-319735 are incorporated into this specification by reference.

What is claimed is:

1. A multiphoton-absorption exposure method for exposing a multiphoton absorption material, comprising the steps of:
   (a) changing an exposure condition for exposing said multiphoton absorption material to light so that optical reactions are more likely to occur when the light converges at deeper positions in the multiphoton absorption material; and
   (b) applying said light to said multiphoton absorption material so that the light converges at a predetermined convergence position in the multiphoton absorption material under said exposure condition changed in said step (a).

2. A multiphoton-absorption exposure method according to claim 1, wherein said exposure condition includes at least one of an exposure intensity, an exposure time, and a wavelength of said light.

3. A multiphoton-absorption exposure method according to claim 2, wherein at least one of said exposure intensity and said exposure time is controlled by modulating said light with a light modulator.

4. A multiphoton-absorption exposure method according to claim 1, wherein said light is pulsed light emitted from a pulse laser.

5. A multiphoton-absorption exposure method according to claim 1, wherein said multiphoton absorption material is an ultraviolet-curing resin.

6. A multiphoton-absorption exposure method according to claim 1, wherein said multiphoton absorption material is three-dimensionally exposed by controlling said convergence position in three directions including a depth direction and two directions which are different from the depth direction.

7. A multiphoton-absorption exposure apparatus for exposing a multiphoton absorption material, comprising:
   an exposure-condition control unit which changes an exposure condition for exposing said multiphoton absorption material to light so that optical reactions are more likely to occur when the light converges at deeper positions in the multiphoton absorption material; and
   an exposure unit which applies said light to said multiphoton absorption material so that the light converges at a predetermined convergence position under said exposure condition changed by said exposure-condition control unit.

8. A multiphoton-absorption exposure apparatus according to claim 7, wherein said exposure condition includes at least one of an exposure intensity, an exposure time, and a wavelength of said light.

9. A multiphoton-absorption exposure apparatus according to claim 8, further comprising a light modulator which modulates said light so as to control at least one of said exposure intensity and said exposure time.

10. A multiphoton-absorption exposure apparatus according to claim 7, further comprising a pulse laser which emits pulsed light as said light.

11. A multiphoton-absorption exposure apparatus according to claim 7, further comprising a three-dimensional-exposure control unit which controls said convergence position in three directions including a depth direction and two directions which are different from the depth direction, for realizing three-dimensional exposure of said multiphoton absorption material.

12. A multiphoton-absorption exposure apparatus according to claim 11, wherein said three-dimensional-exposure control unit includes a three-axis movement table for three-dimensionally moving said multiphoton absorption material with respect to said light.

13. A multiphoton-absorption exposure apparatus according to claim 7, further comprising a storage unit which stores a table defining exposure conditions for possible values of the depth of said predetermined convergence position, and said exposure-condition control unit determines said exposure condition for exposing said multiphoton absorption material, by referring to said table based on an actual value of the depth of said predetermined convergence position.

* * * * *